(12) United States Patent
Tserng et al.

(10) Patent No.: US 6,787,826 B1
(45) Date of Patent: Sep. 7, 2004

(54) HETEROSTRUCTURE FIELD EFFECT TRANSISTOR

(75) Inventors: Hua Quen Tserng, Dallas, TX (US); Edward A. Beam, III, Plano, TX (US); Ming-Yih Kao, Dallas, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 10/390,261

(22) Filed: Mar. 14, 2003

(51) Int. Cl.$^7$ ............................................. H01L 29/812
(52) U.S. Cl. ....................... 257/280; 257/283; 257/284; 438/570; 438/572
(58) Field of Search .................................... 257/192, 280, 257/282–284; 438/570, 572

(56) References Cited

U.S. PATENT DOCUMENTS

| | | | | |
|---|---|---|---|---|
| 5,241,197 A | * | 8/1993 | Murakami et al. | ........... 257/192 |
| 5,596,211 A | * | 1/1997 | Onda et al. | ................... 257/196 |
| 6,034,386 A | * | 3/2000 | Ando | .......................... 257/280 |
| 6,194,747 B1 | * | 2/2001 | Onda | .......................... 257/192 |
| 6,242,293 B1 | | 6/2001 | Danzilio | |
| 6,258,639 B1 | | 7/2001 | Rohdin et al. | |
| 6,307,221 B1 | | 10/2001 | Danzilio | |
| 6,521,961 B1 | | 2/2003 | Costa et al. | |
| 6,555,850 B1 | | 4/2003 | Sakamoto et al. | |
| 6,593,603 B1 | | 7/2003 | Kim et al. | |
| 6,620,662 B2 | * | 9/2003 | Hoke et al. | .................. 438/172 |
| 2002/0171076 A1 | | 11/2002 | Danzilio | |

OTHER PUBLICATIONS

Chen et al.; High–Transconductance Insulating–Gate InP/InGaAs Buried p–Buffer DH–MODFET's Grown by MOVPE; IEEE Electron Device Letters, vol. 10. No. 4, Apr. 1989; pp. 162–164.

Toyoda et al., "An Application of Pt–GaAs reaction to GaAs ICs," Inst. Phys. Conf. Ser. No. 63, Chapter 11, pp. 521–526 (1981).

Schultz et al., "Morphological Development During Platinum/Gallium Arsenide Interfacial Reactions," J. of Elect. Mat., 19, #6, pp. 581–589 (1990).

Ko, Dae–Hong and Robert Sinclair, "In–situ dynamic high––resolution transmission electron microscopy: application to Pt/GaAs interfacial reactions," Ultramicroscopy, 54, pp. 166–178 (1994).

Saka et al., "Low Standby Leakage Current Power Amplifier Module Made with Junction PHEMT Technology," 25$^{th}$ IEEE GaAs IC Symposium Technical Digest, pp. 301–304 (2003).

\* cited by examiner

*Primary Examiner*—Allan R. Wilson
(74) *Attorney, Agent, or Firm*—Bever, Hoffman & Harms, LLP; James E. Parsons

(57) ABSTRACT

A high electron mobility transistor is constructed with a substrate, a lattice-matching buffer layer formed on the substrate, and a heavily doped p-type barrier layer formed on the buffer layer. A spacer layer is formed on the barrier layer, and a channel layer is formed on the spacer layer. The channel layer may be of uniform composition, or may be made from two or more sublayers. A Schottky layer is formed over the channel layer, and source and drain contacts are formed on the Schottky layer. The substrate may be gallium arsenide, indium phosphide, or other suitable material, and the various semiconductor layers formed over the substrate contain indium. The transistor's transition frequency of the transistor is above 200 GHz.

30 Claims, 2 Drawing Sheets

HETEROSTRUCTURE FIELD EFFECT TRANSISTOR

BACKGROUND

1. Field of Invention

The invention relates to high electron mobility transistors (HEMTs) and metamorphic HEMTs (MHEMTs).

2. Related Art

HEMTs are active semiconductor devices that are identified by high electron mobility in the channel (e.g., above 6,000 volt/cm$^2$-sec.). HEMTs typically use compounds containing indium for the channel, since the electron mobility for indium arsenide is higher than in many other elements and compounds used to construct transistors (e.g., silicon, gallium arsenide). This high electron mobility allows the device to operate at frequencies higher than other (e.g., silicon based) semiconductor devices. Further, HEMTs provide low noise in very high frequency (e.g., 100 gigaHertz (GHz)) applications. Due to these desirable characteristics, HEMTs are replacing metal semiconductor field effect transistors (MESFETs) in high speed communication devices (e.g., switches).

Transistors have an intrinsic gain roll-off as the frequency of the signal applied to the gate (input signal) increases. A typical gain roll-off is about –20 dB per frequency decade (e.g., 1 GHz to 10 GHz) or –6 dB per octave (frequency doubling). A transistor's transition frequency ($F_T$) is the frequency at which unity current gain occurs for a particular bias. Bias may be optimized for a transistor to provide the highest possible $F_T$. The maximum $F_T$ for current HEMTs is about 200 GHz.

Since electron speed in semiconductor material is limited, transistor dimensions (e.g., gate length) are decreased to provide higher switching (e.g., on-off) speeds. But low sub-micron transistors (e.g., minimum feature size below 0.25 micrometer ($\mu$m)) often experience unacceptably high off-state current. This high off-state current problem is called the short channel effect, and it results from an inability to effectively pinch off the channel during the off-state. This short channel effect acts to limit transistor switching speeds, and current HEMTs suffer from this short channel effect.

Therefore, what is required is a HEMT with decreased short channel effect (lesser off-state current) to allow the HEMT to operate with an $F_T$ above 200 GHz.

SUMMARY

An illustrative high electron mobility transistor is constructed with a substrate, a buffer layer formed on the substrate, and a heavily doped p-type barrier layer formed on the buffer layer. In one illustrative embodiment, the substrate is gallium arsenide (GaAs) and the buffer layer is a relaxed lattice metamorphic layer containing indium. In a second illustrative embodiment, the substrate is indium phosphide (InP) and the buffer layer is a lattice matching indium aluminum arsenide layer. A spacer layer is formed on the barrier layer, and a channel layer is formed on the spacer layer. The channel layer may be of uniform composition, or may be made from two or more sublayers. A Schottky layer is formed over the channel layer, and source and drain contacts are formed on the Schottky layer. The transistor is formed to have a channel length of 0.25 $\mu$m or less (e.g., 0.15 $\mu$m or less).

In the illustrative HEMT embodiments, one or more of the HEMT structure layers overlying the substrate contain indium to provide high electron mobility. A heavily doped p-type barrier layer improves electron confinement within the channel layer, thereby eliminating the short channel effect at frequencies above 100 GHz and allowing enhancement-mode operation by minimizing surface depletion effect. This structure provides an $F_T$ above 200 GHz. A lattice-relaxed buffer layer allows the transistor to be formed using a GaAs substrate, with a resulting manufacturing cost decrease due to the larger size, lower cost, and robustness of gallium arsenide wafers. Alternatively, a HEMT is formed over a substrate that contains indium or other semiconductor materials.

DETAILED DESCRIPTION

Practitioners will understand that the drawings are not to scale, and that other well-known features (e.g., substrate grounding, isolation regions) are omitted so as to more clearly illustrate the invention.

HEMTs are formed as heterostructures (single crystal with junction between two different semiconductor materials) over a semiconductor substrate (e.g., wafer), such as GaAs or InP, or over a buffer layer overlying the substrate. Since the HEMT's active device layers typically contain indium, the crystal lattice of the underlying substrate or buffer layer must be matched with the lattice of the HEMT's layers overlying the substrate. If a GaAs substrate is used, a relaxed-lattice metamorphic buffer layer is formed between the GaAs substrate and an overlying layer associated with the HEMT structure (e.g., a layer transitioning from aluminum arsenide (AlAs) at the GaAs junction to indium aluminum arsenide ($In_xAl_{x-1}$ As) at the junction with the first HEMT structure layer). Such a metamorphic buffer layer does not provide lattice matching with the GaAs substrate, but the metamorphic buffer layer's indium composition will allow lattice matching to the HEMT's active layers. HEMTs formed over such metamorphic buffer layers are referred to as MHEMTs.

If an InP substrate is used, an indium aluminum arsenide ($In_xAl_{x-1}As$) layer is used to lattice match the InP substrate and the first overlying layer associated with the HEMT structure. HEMTs formed over InP are referred to as InP HEMTs.

By using a metamorphic or lattice matching buffer layer, HEMTs having similar performance due to having channel compositions with about the same mole fraction of indium may be formed over either GaAs or InP substrates. Compared with InP substrates, however, GaAs substrates are typically larger, less expensive, and more rugged.

Figure 1:
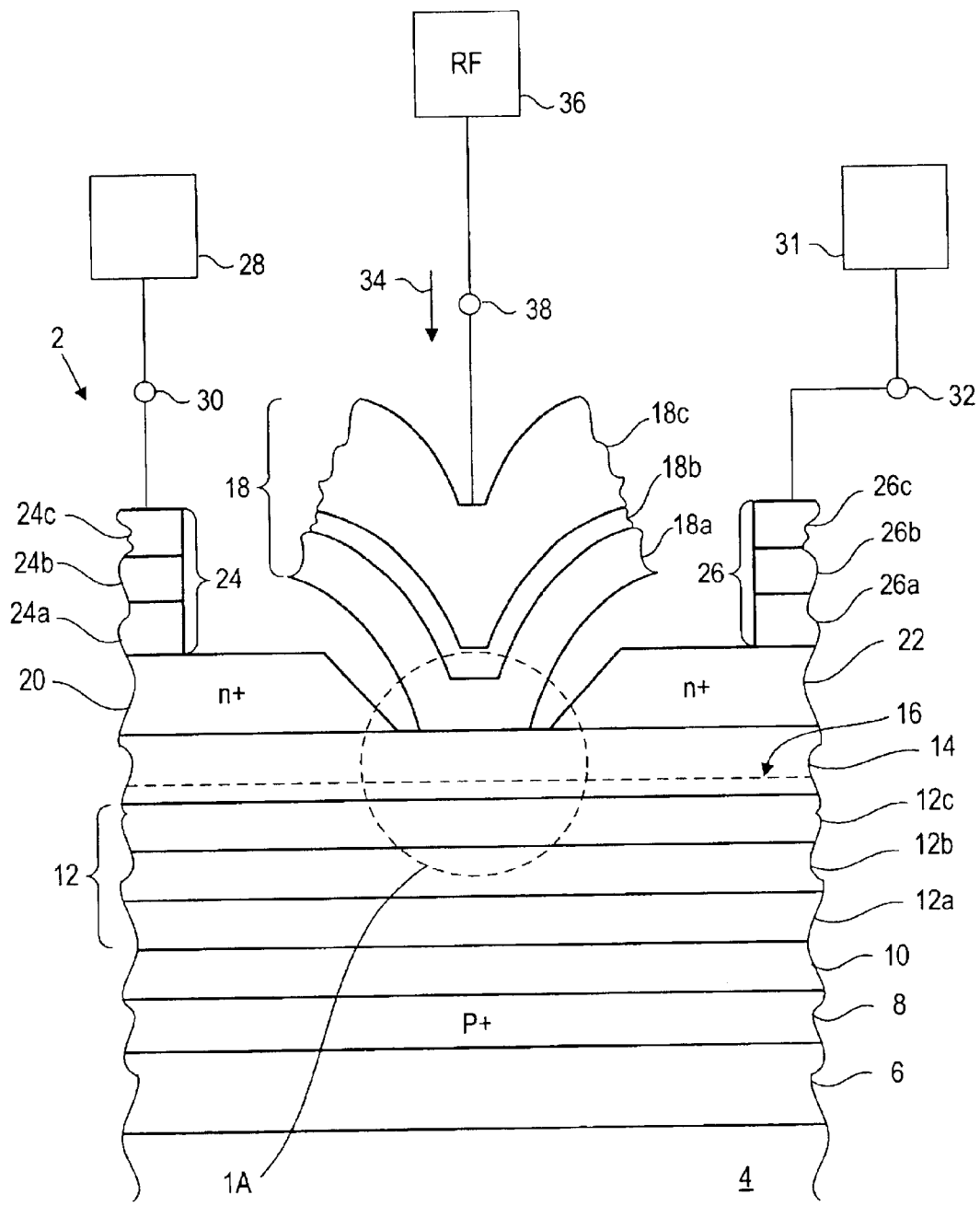
FIG. 1 is a cross-sectional view of a transistor.

FIG. 1 is a cross-sectional view of a portion of a HEMT 2 formed in an integrated circuit (e.g., on a semiconductor chip). Embodiments of HEMT 2 are formed of layers of various materials, as described below. As shown in FIG. 1, HEMT 2 is structured as follows: buffer layer 6 is formed over substrate 4; heavily doped p-type (p+) barrier layer 8 is formed over buffer layer 6; spacer layer 10 is formed over barrier layer 8; channel layer 12, depicted as including sublayer 12a formed on spacer layer 10, sublayer 12b formed on sublayer 12a, and sublayer 12c formed on sublayer 12b, is formed over spacer layer 10; Schottky layer 14 is formed over composite channel layer 12; and a cap layer—shown patterned as source contact 20 and drain contact 22—is formed on Schottky layer 14. Horizontal dashed line 16 in layer 14 signifies that planar doping is used in Schottky layer 14. Planar doping yields a doping thickness of a few angstroms, which is much thinner than other doping methods, such as double-pulse doping, that produce thicknesses of, e.g., 500 Å.

FIG. 1 also shows that composite gate contact 18 is formed on Schottky layer 14 and includes sublayer 18a formed on Schottky layer 14, sublayer 18b formed on sublayer 18a, and sublayer 18c formed on sublayer 18b. As depicted in FIG. 1, source contact layer 20 is to the left of gate contact 18 and is formed on Schottky layer 14. FIG. 1 also depicts drain contact layer 22 to the right of gate contact 18 and formed on Schottky layer 14. Composite metal source contact 24 is formed on source contact layer 20 and is depicted as including sublayer 24a formed on contact layer 20, sublayer 24b formed on sublayer 24a, and sublayer 24c formed on sublayer 24b. Similarly, composite metal drain contact 26 is formed on drain contact layer 22 and includes sublayer 26a formed on layer 22, sublayer 26b formed on sublayer 26a, and sublayer 26c formed on sublayer 26b.

During operation, source voltage driver 28 supplies a voltage (e.g., ground potential) to source layer 20 via source terminal 30 and drain voltage driver 31 supplies a voltage (e.g., $V_d$ of 0.5 to 3 V) to drain layer 22 via drain terminal 32. Gate contact 18 receives radio frequency (RF) signal 34 from RF signal source 36 via gate terminal 38 (e.g., −0.3 to 0.6 V), thereby controlling carrier movement in channel 12 between the source and drain of HEMT 2. In some embodiments, HEMT 2 is an enhancement mode transistor. In some cases, signal 34 is at least 200 GHz and in other cases signal 34 is at least 260 GHz.

In the illustrative HEMT embodiments described below, InAlAs is used to form several device layers. InAlAs is used instead of, for example, InP, because InAlAs layers provide superior carrier transport properties.

In one instance, the HEMT's structure layers overlying substrate 4 are formed using molecular beam epitaxy (MBE). In another instances, however, these HEMT structure layers may be formed using metal organic chemical vapor deposition (MOCVD; aka MOVPE or OMVPE). In one instance, a metamorphic buffer layer (an illustrative embodiment of buffer layer 6) is grown at a temperature of 400° C. and growth rates varying from 0.1 to 2.0 μm per hour using standard indium and aluminum effusion cells and a valved arsenic cracker cell to control the V:III ratio to a value slightly over 1.0. Upon completion of the metamorphic buffer layer, the substrate temperature is raised to 480 to 520° C. to grow HEMT 2's active layers. Standard MBE growth conditions for InP-based epitaxy are used to grow the HEMT's active layers. A beryllium effusion cell is used to dope layer 8 p-type.

GaAs Substrate

In one illustrative embodiment, substrate 4 is GaAs. In this embodiment, buffer layer 6 is a metamorphic layer and has a gradient composition beginning with aluminum arsenide (AlAs) at the junction with substrate 4 and transitioning to the composition of barrier layer 8 (e.g., $In_{0.45}Al_{0.55}As$) at the junction with barrier layer 8. Buffer layer 6 is about 1 μm thick, although other thicknesses may be used to provide sufficient lattice relaxation between the substrate and the next overlying layer.

The thickness of barrier layer 8 may vary from a few atomic layers (e.g., 5 angstroms (Å)) to 200 Å or more. In one instance, the composition of barrier layer 8 is $In_{0.45}Al_{0.55}As$, and layer 8 is heavily doped to p-type conductivity (p+). This composition is illustrative of other barrier layer 8 compositions containing from 0 to 75 percent indium, such as one described below for an InP substrate embodiment, in which specific percentages of indium are chosen to optimize HEMT performance. Since there is an inverse relationship between breakdown voltage and $F_T$, optimization involves a power/speed trade-off. That is, a higher In percentage results in a higher $F_T$ but lower breakdown voltage. In some embodiments, barrier layer 8 is doped with beryllium (Be) to concentrations from $1*10^{18}$ to $10*10^{19}$ atoms/cm$^3$. In other embodiments, carbon (C) is used as a dopant to form barrier layer 8. In some embodiments the barrier layer 8 indium concentration, dopant level, and thickness are optimized such that barrier layer 8 is completely depleted during operation to minimize parasitic bipolar action.

Since barrier layer 8 is heavily doped p-type, barrier layer 8 acts to enhance the off-state depletion region in channel layer 12 below the gate electrode and thereby reduces the short channel effect. Further, this enhanced depletion region serves to confine electrons within channel layer 12 when HEMT 2 is in the on state. HEMT 2's output conductance is decreased due to this enhanced channel layer 12 electron confinement. As a result, the $F_T$ of HEMT 2 is increased by about 30–40 percent over prior art devices operating at an $F_T$ of about 200 GHz (i.e., HEMT 2 $F_T$ is over 260 GHz). Barrier layer 8 also minimizes the effect of surface depletion for efficient enhancement mode operation.

Spacer layer 10 is an undoped InAlAs layer with 0 to 75 percent In and a thickness of 10 to 50 Å. The spacer layer 10 composition and thickness is varied to optimize the HEMT's speed or breakdown voltage. In one instance, spacer layer 10 is an undoped $In_{0.45}Al_{0.55}As$ layer about 30 to 40 Å thick. Positioning spacer layer 10 between barrier layer 8 and channel layer 12 improves the electron mobility in channel layer 12 by screening channel layer 12 from barrier layer 8, thereby reducing carrier scattering. In the illustrative embodiment shown in FIG. 1, only spacer layer 10 is formed between barrier layer 8 and channel layer 12, since an electron supply layer below channel layer 12 tends to increase the short channel effect.

Channel layer 12 is shown in FIG. 1 as including three composite sublayers, but may also be of uniform composition about 130–200 Å thick. If channel layer 12 is formed with a uniform composition, then channel layer 12 is formed of $In_xGa_{x-1}As$ with an indium mole fraction in the range of 0.2–1.0. In one instance, the In mole fraction is in the range of 0.43–0.53. The indium concentration is varied directly in relation to, for example, the anticipated HEMT 2 operating frequency, desired breakdown voltage, or turn-on voltage. If channel layer 12 is formed of sublayers, the total channel layer 12 thickness is also about 130–200 Å. The use of sublayers to form channel layer 12, with each unique sublayer having a different mole fraction of indium, improves the gate/drain breakdown voltage as compared with the use of a channel with uniform indium composition. In one instance channel sublayer 12a is 80 Å thick $In_{0.58}Ga_{0.42}As$, channel sublayer 12b is 70 Å thick $In_{0.63}Ga_{0.37}As$, and channel sublayer 12c is 30 Å thick $In_{0.53}Ga_{0.47}As$. These channel sublayer 12a–12c compositions are selected as an optimization of $F_T$ and breakdown voltage. Other channel sublayer 12a–12c mole fractions (e.g., 30 to 70 percent indium) and thicknesses (e.g., 20 to 100 Å) maybe used in other instances. These channel layer 12 compositions and thicknesses are subject to material growth quality and breakdown voltage constraints. In general, channel layer 12 is made thinner as the anticipated frequency of operation increases, but channel layer 12 must have sufficient carriers to function at the anticipated operating frequency. Channel sublayers 12a–12c are formed using molecular beam epitaxy by changing the relative flux densities of the indium and gallium sources during growth to obtain the desired compositions of the sublayers. Growth interruptions of up to 2 minutes are incorporated to stabilize the fluxes prior to the growth of each sublayer.

In one instance, Schottky (electron supply) layer 14 is 80 to 150 Å thick $In_{0.45}Al_{0.55}As$ Schottky layer 14 is doped to have n-type conductivity (n) by planar doping with silicon to about $5*10^{12}$ atoms/cm$^3$, which is depicted in FIG. 1 by dashed line 16. Other Schottky layer 14 thicknesses (e.g., 30 to 50 Å) and dopant concentrations (e.g., up to $1*10^{13}$) may be used, depending on the desired threshold voltage. Schottky layer 14 is formed using molecular beam epitaxy by exposing the surface to a flux of silicon (Si) atoms in the MBE reactor, thereby forming a plane or partial plane of Si atoms. Depending on the thickness of Schottky layer 14, the HEMT 2 embodiments are operated either as enhancement mode or depletion mode devices. If Schottky layer 14 is thin (e.g., less than about 100 Å), HEMT 2 operates as an enhancement mode transistor. If Schottky layer 14 is made thicker (e.g., more than about 100 Å), HEMT 2 operates as a depletion mode transistor.

Gate contact 18 requires a Schottky metal. In the embodiment illustrated in FIG. 1, gate contact 18 is a composite of three sublayers 18a–18c. In one exemplary instance, sublayer 18a is titanium, sublayer 18b is platinum, and sublayer 18c is gold. Other materials (e.g., platinum/titanium/platinum/gold, molybdenum/gold) may be used to form gate contact 18.

Figure 1A:
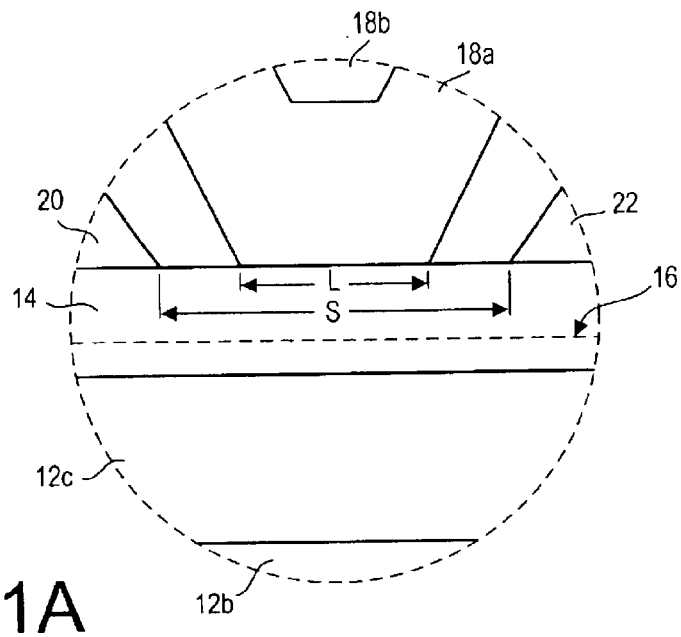
FIG. 1A shows a detail of FIG. 1.

Source contact 20 and drain contact 22 are heavily doped n-type (n+) InGaAs and provide ohmic contact to Schottky layer 14. In one embodiment source and drain contacts 20 and 22 are doped during MBE growth with Si to a concentration of about $1*10^{19}$ atoms/cm$^3$. Referring to FIG. 1A, the distance S between source contact 20 and drain contact 22 (i.e., source-drain spacing) is about 2 to 3 μm. The gate length L is about 0.10 to 0.15 μm to provide high speed operation above 100 GHz. Some HEMT 2 embodiments operate effectively if receiving signals 34 in the range of about 200 to 300 GHz. Referring again to FIG. 1, contacts 24 and 26 are composites of three sublayers. In one embodiment, contact layers 24a,26a are gold, contact layers 24b,26b are germanium, and contact layers 24c,26c are nickel. Other materials (e.g., gold/molybdenum, titanium/tungsten) may be used to form contacts 24,26.

InP Substrate

In a second illustrative embodiment, substrate 4 is InP. In one instance of this illustrative embodiment, buffer layer 6 is $In_{0.53}Al_{0.47}As$ about 1 μm thick and is lattice matched to the underlying substrate 4. Other buffer layer 6 compositions and thicknesses may be used.

In one instance, the composition of p+ barrier layer 8 is $In_{0.53}Al_{0.47}As$. This composition is used so that barrier layer 8 is lattice matched to the underlying InP substrate, although other compositions may be used as described above. In some InP substrate embodiments, barrier layer 8 is beryllium doped to a concentration of $1*10^{17}$ to $10*10^{19}$ atoms/cm$^3$. MBE growth is used to form the semiconductor layers overlying substrate 4. Standard MBE growth conditions for InP-based epitaxy were used to grow an undoped lattice-matched InAlAs buffer layer 6 and the HEMT's active layers. In one instance, a beryllium effusion cell was used to dope barrier layer 8 p-type. Buffer layer 8 is carbon doped in other embodiments.

The remaining layers formed over barrier layer 8 are as illustratively described above with reference to the GaAs substrate embodiments.

Figure 2:
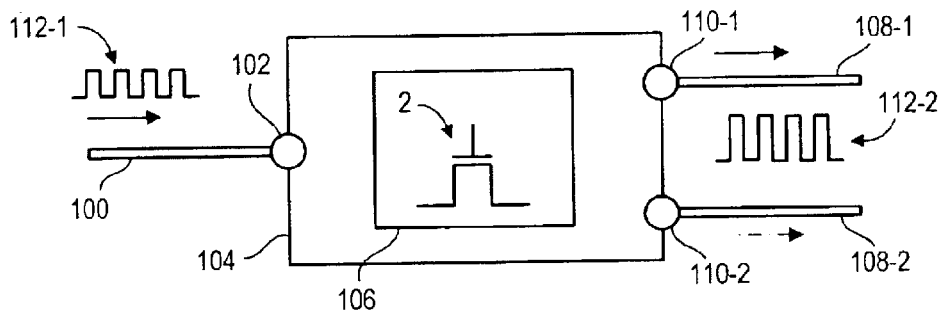
FIG. 2 is a diagrammatic view of a digital switching circuit.

FIG. 2 is a diagrammatic view of an illustrative digital circuit that incorporates an embodiment of the invention. As shown in FIG. 2, input optical fiber 100 is coupled via input optical coupler 102 to switch 104. Switch 104 includes digital switching circuit 106 of conventional design, except that HEMT 2 is used in circuit 106. Output optical fibers 108-1 and 108-2 are also coupled to switch 104 via output optical couplers 110-1 and 110-2, respectively. In an exemplary operation, switch 104 receives optically modulated digital input signal 112-1 and conventionally converts signal 112-1 to an electronic signal containing address and content data. Switching circuit 106 receives this electronic signal and determines a destination address for the content. The use of HEMT 2 allows switch 106 to process such a signal having a data rate in excess of 40 Gigabits per second (Gb/s). Following switching circuit 106's switching operation, the electronic signal is converted to an optical signal and is routed as output signal 112-2 to output fiber 108-1, or alternatively fiber 108-2, as appropriate.

Figure 3:
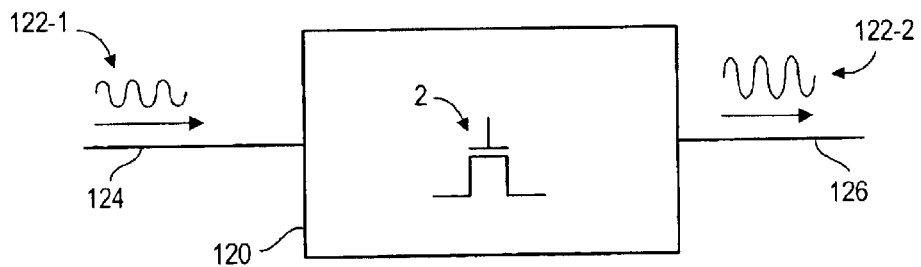
FIG. 3 is a diagrammatic view of an analog amplifier circuit.

FIG. 3 is a diagrammatic view of an illustrative analog circuit that incorporates an embodiment of the invention. Analog circuit 120 is of conventional design, except that HEMT 2 is used in circuit 120. Circuit 120 receives analog input signal 122-1 via input line 124, performs, for example, an amplification, and outputs analog output signal 122-2 via output line 126. The use of HEMT 2 allows circuit 120 to, e.g., amplify with minimal distortion signals 122-1 having frequencies above 100 GHz.

The invention has been described in terms of specific embodiments. Practitioners will understand, however, that many variations, modifications, and substitutions are possible. For example, compounds of other III–V elements may be used as substrate 4. Layer thicknesses are illustrative and may be varied. Illustrative too are the specific mole fractions, dopant types, and dopant levels. The invention is therefore limited only by the scope of the following claims.

We claim:

1. A transistor comprising:
   a substrate;
   a buffer layer formed directly on the substrate, wherein the buffer layer grades a lattice constant from the substrate to a lattice constant at an overlying layer;
   a barrier layer formed over the buffer layer, wherein the barrier layer comprises a p-type dopant concentration above $1*10^{17}$ atoms/cm$^3$;
   a spacer layer formed directly on the barrier layer;
   a channel layer formed directly on the spacer layer; and
   a Schottky layer formed over the channel layer;
   wherein the buffer, barrier, spacer, channel, and Schottky layers each comprise indium.

2. The transistor of claim 1, wherein the substrate comprises gallium arsenide.

3. The transistor of claim 1, wherein the channel layer comprises a plurality of sublayers, each unique said channel sublayer comprising a mole fraction of indium different from each other said channel sublayer.

4. The transistor of claim 1 further comprising a source contact formed directly on the Schottky layer and a drain contact formed directly on the Schottky layer, wherein a distance between the source and drain contacts is less than about 3 µm.

5. The transistor of claim 1 further comprising an electrically conductive gate comprising a gate length of less than about 0.15 µm.

6. The transistor of claim 1, wherein a transition frequency of the transistor is above 260 gigaHertz.

7. A transistor comprising:
a substrate;
a buffer layer formed directly on the substrate, wherein the buffer layer is lattice-matched to the substrate and grades a lattice constant from the substrate to a lattice constant at an overlying layer;
a barrier layer formed over the buffer layer, wherein the barrier layer comprises a p-type dopant concentration above $1*10^{17}$ atoms/cm$^3$;
a spacer layer formed directly on the barrier layer;
a channel layer formed directly on the spacer layer; and
a Schottky layer formed over the channel layer;
wherein the buffer, barrier, spacer, channel, and Schottky layers each comprise indium.

8. The transistor of claim 7, wherein the substrate comprises indium phosphide.

9. The transistor of claim 7, wherein the channel layer comprises a plurality of sublayers, each unique said channel sublayer comprising a mole fraction of indium different from each other said channel sublayer.

10. The transistor of claim 7 further comprising a source contact formed directly on the Schottky layer and a drain contact formed directly on the Schottky layer, wherein a distance between the source and drain contacts is less than about 3 µm.

11. The transistor of claim 7 further comprising a gate length of less than about 0.15 µm.

12. The transistor of claim 7, wherein a transition frequency of the transistor is above 260 gigaHertz.

13. A method of forming a transistor, comprising the acts of:
providing a substrate;
forming a buffer layer directly on the substrate, wherein the buffer grades a lattice constant from the substrate to a lattice constant at an overlying layer;
forming a barrier layer over the buffer layer, and doping the barrier layer to a p-type dopant concentration above $1*10^{17}$ atoms/cm$^3$;
forming a spacer layer directly on the barrier layer;
forming a channel layer directly on the spacer layer; and
forming a Schottky layer over the channel layer;
wherein the buffer, barrier, spacer, channel, and Schottky layers each comprise indium.

14. The method of claim 13, wherein the substrate comprises gallium arsenide.

15. The method of claim 13 further comprising the acts of forming the channel layer to comprise a plurality of sublayers, and forming each unique said channel sublayer to comprise a mole fraction of indium different from each other said channel sublayer.

16. The method of claim 13 further comprising the act of forming a source contact directly on the Schottky layer and a drain contact directly on the Schottky layer, wherein a distance between the source and drain contacts is less than about 3 µm.

17. The method of claim 13 further comprising the act of forming an electrically conductive gate comprising a gate length of less than about 0.15 µm.

18. The method of claim 13 further comprising the act of operating the transistor to have a transition frequency above 260 gigaHertz.

19. A method of forming a transistor, comprising the acts of:
providing a substrate;
forming a buffer layer directly on the substrate, wherein the buffer is lattice matched to the substrate and grades a lattice constant from the substrate to a lattice constant at an overlying layer;
forming a barrier layer over the buffer layer, and doping the barrier layer to a p-type dopant concentration above $1*10^{17}$ atoms/cm$^3$;
forming a spacer layer directly on the barrier layer;
forming a channel layer directly on the spacer layer; and
forming a Schottky layer over the channel layer;
wherein the buffer, barrier, spacer, channel, and Schottky layers each comprise indium.

20. The method of claim 19, wherein the substrate comprises indium phosphide.

21. The method of claim 19 further comprising the acts of forming the channel layer to comprise a plurality of sublayers, and forming each unique said channel sublayer to comprise a mole fraction of indium different from each other said channel sublayer.

22. The method of claim 19 further comprising the act of forming a source contact directly on the Schottky layer and a drain contact directly on the Schottky layer, wherein a distance between the source and drain contacts is less than about 3 µm.

23. The method of claim 19 further comprising the act of forming an electrically conductive gate comprising a gate length of less than about 0.15 µm.

24. The method of claim 19 further comprising the act of operating the transistor to have a transition frequency above 260 gigaHertz.

25. An electronic switch comprising a high electron mobility transistor, wherein the high electron mobility transistor comprises:
a substrate;
a barrier layer formed over the substrate, wherein the barrier layer comprises a p-type dopant concentration above $1*10^{17}$ atoms/cm$^3$;
a spacer layer formed directly on the barrier layer; and
a channel layer formed directly on the spacer layer;
wherein the transistor is coupled to receive an input signal and to output an output signal, wherein the input signal comprises a frequency above 260 gigahertz, and wherein the output signal comprises a frequency above 260 gigaHertz.

26. The switch of claim 25 further comprising an optical coupler coupled to provide the input signal to a gate electrode of the transistor.

27. The switch of claim 25 further comprising an optical coupler coupled to receive the output signal from the transistor.

28. The switch of claim 25, wherein the electronic amplifier comprises a digital signal processing circuit.

29. The switch of claim 25, wherein the electronic amplifier comprises an analog signal processing circuit.

30. An electronic switch comprising a high electron mobility transistor, wherein the high electron mobility transistor comprises:

a substrate;

a barrier layer formed over the substrate, wherein the barrier layer comprises a p-type dopant concentration above $1*10^{17}$ atoms/cm$^3$;

a spacer layer formed directly on the barrier layer; and a channel layer formed directly on the spacer layer; wherein the transistor is coupled to receive an input signal and to output an output signal, wherein the input signal comprises a data rate above 40 gigabits per second, and wherein the output signal comprises a data rate above 40 gigabits per second.

* * * * *